(12) United States Patent
Tsujii

(10) Patent No.: US 6,300,577 B1
(45) Date of Patent: Oct. 9, 2001

(54) FILM CARRIER AND METHOD OF BURN-IN TESTING

(75) Inventor: Toshiyuki Tsujii, Tokyo (JP)

(73) Assignee: Mitsubishi Denki & Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/118,927

(22) Filed: Jul. 20, 1998

(30) Foreign Application Priority Data

Apr. 28, 1998 (JP) .................................................. 10-118690

(51) Int. Cl.[7] .............................. H01R 12/04; H05K 1/11
(52) U.S. Cl. ....................... 174/261; 324/765; 361/767; 361/777
(58) Field of Search ..................................... 174/261, 250, 174/255; 361/772, 767, 768, 769, 770, 771, 773, 774, 775, 776, 777, 778, 779; 324/763, 765

(56) References Cited

U.S. PATENT DOCUMENTS

| 4,467,400 | * | 8/1984 | Stopper | 361/403 |
| 4,479,088 | * | 10/1984 | Stopper | 324/73 R |
| 4,717,988 | * | 1/1988 | Landis | 361/403 |
| 4,806,409 | * | 2/1989 | Walter et al. | 428/138 |
| 4,814,855 | * | 3/1989 | Hodgson et al. | 174/52.4 |
| 4,899,174 | * | 2/1990 | Newman et al. | 346/107 R |
| 5,028,983 | * | 7/1991 | Bickford et al. | 357/69 |
| 5,036,380 | * | 7/1991 | Chase | 357/70 |
| 5,216,806 | * | 6/1993 | Lam | 29/848 |
| 5,448,451 | * | 9/1995 | Takubo et al. | 361/749 |
| 5,726,075 | * | 3/1998 | Farnworth et al. | 438/18 |
| 5,821,609 | * | 10/1998 | DiStefano et al. | 257/669 |
| 6,075,711 | * | 6/2000 | Brown et al. | 361/761 |

FOREIGN PATENT DOCUMENTS 2-500221    1/1990    (JP) .

\* cited by examiner

Primary Examiner—Jeffrey Gaffin
Assistant Examiner—Jeremy Norris
(74) Attorney, Agent, or Firm—Oblon, Spivak, McClelland, Maier & Neustadt, P.C.

(57) ABSTRACT

A film carrier includes a base film (1), a first interconnect line (5a) formed on the top surface of the base film (1) and connected to test pads (3), and a second interconnect line (5b) formed on the bottom surface of the base film (1) and connected to the test pads (3). After leads (6) are plated, connecting portions between the first interconnect line (5a) and other than one of the test pads which is associated with a pad which is to receive a power supply potential, and connecting portions between the second interconnect line (5b) and other than one of the test pads which is associated with a pad which is to receive a ground potential are severed using a laser and the like. Then, the film carrier is wound onto a reel, and the reel with the film carrier wound thereon is loaded into a burn-in apparatus. A potential supply portion of the burn-in apparatus applies the power supply potential to the first interconnect line (5a) and applies the ground potential to the second interconnect line (5b). The film carrier and a method of burn-in testing eliminate the need for a burn-in board and a socket and reduce the time for preparation for burn-in.

14 Claims, 12 Drawing Sheets

FILM CARRIER AND METHOD OF BURN-IN TESTING

BACKGROUND OF THE INVENTION

1. Field of the Invention

The present invention relates to the structure of a film carrier and a method of collectively burn-in testing IC chips assembled on a base film of the film carrier by the TAB (Tape Automated Bonding) technique.

2. Description of the Background Art

FIG. 12 is a top view showing a top structure of a conventional film carrier. FIG. 13 is a bottom perspective view showing a bottom structure of the film carrier of FIG. 12 as seen through from above. The film carrier comprises a base film 101 provided with a plurality of sprocket holes 102 arranged at regularly spaced apart intervals in the longitudinal direction of the base film 101. IC chips 104 are assembled on the base film 101 by the TAB technique. A plurality of test pads 103 in corresponding relation to a plurality of pads (not shown) of the IC chips 104 are formed on the base film 101. The test pads 103 and the pads of the IC chips 104 are connected to each other through leads 106 formed on the top surface of the base film 101, respectively. All of the test pads 103 are connected to an interconnect line 105 formed on the top surface of the base film 101. The interconnect line 105 is provided for electroplating the leads 106 and generally known as a plating line. A predetermined potential is applied from the interconnect line 105 through the test pads 103 to the leads 106 in a predetermined metal solution to electroplating the surfaces of the leads 106 for improvements in corrosion resistance of the leads 106.

For mounting the IC chips 104 on a circuit board, the leads 106 are severed at some midpoints, and the severed leads 106 are connected to electrodes of the circuit board. In general, tests are carried out on the IC chips 104 prior to the severing of the leads 106, that is, with the IC chips 104 assembled on the base film 101. One of the tests includes a burn-in test to be conducted on the IC chips 104.

FIG. 14 illustrates a method of burn-in testing the IC chips 104. First, the film carrier is severed into pieces each including an IC chip 104, and connecting portions between the interconnect line 105 and the test pads 103 are cut off. Then, the pieces of the film carrier each of which includes an IC chip 104 are mounted in sockets 107 installed on a burn-in board 108. Next, the burn-in board 108 is loaded into a burn-in apparatus 109. Thereafter, a predetermined power supply potential and a predetermined ground potential are applied from the burn-in apparatus 109 to predetermined ones of the test pads 103.

However, such a conventional film carrier is disadvantageous in that the burn-in testing of the IC chips assembled on the base film requires the burn-in board and the sockets, to result in increased costs.

Further, it takes time to mount the severed pieces of the film carrier each including an IC chip into the sockets. This causes prolonged time for preparation for the burn-in test.

Additionally, the limited capacity of the burn-in apparatus imposes limitations on the number of burn-in boards to be loaded in the burn-in apparatus at one time and accordingly on the number of IC chips to be subjected to the burn-in test at one time.

SUMMARY OF THE INVENTION

According to a first aspect of the present invention, a film carrier comprises: a base film; a plurality of test pads provided on the base film in corresponding relation to a plurality of pads of each IC chip assembled on the base film; a first interconnect line provided on the base film and connected commonly to the plurality of test pads; and a second interconnect line provided on the base film and connected commonly to the plurality of test pads, the second interconnect line being electrically insulated from the first interconnect line except where the plurality of test pads are provided.

Preferably, according to a second aspect of the present invention, in the film carrier of the first aspect, at least one of the first and second interconnect lines is a plating line for electroplating leads for providing connection between the test pads and the pads.

Preferably, according to a third aspect of the present invention, in the film carrier of the first aspect, the plurality of test pads are selectively formed through between first and second major surfaces of the base film, the first interconnect line being provided on the first major surface of the base film, the second interconnect line being provided on the second major surface of the base film.

Preferably, according to a fourth aspect of the present invention, in the film carrier of the third aspect, the first and second interconnect lines are connected to the test pads so as to be in two-dimensionally non-overlapping relationship with each other at connecting portions between the first and second interconnect lines and the test pads.

A fifth aspect of the present invention is intended for a method of collectively burn-in testing IC chips of a film carrier, the film carrier including a base film, a plurality of test pads provided on the base film in corresponding relation to a plurality of pads of each of the IC chips assembled on the base film, a first interconnect line provided on the base film and connected commonly to the plurality of test pads, and a second interconnect line provided on the base film and connected commonly to the plurality of test pads, the second interconnect line being electrically insulated from the first interconnect line except where the plurality of test pads are provided. According to the present invention, the method comprises the steps of: (a) severing first connecting portions between the first interconnect line and other than one of the test pads which is associated with a first pad, the first pad being one of the plurality of pads which is to receive a predetermined first potential; (b) severing second connecting portions between the second interconnect line and other than one of the test pads which is associated with a second pad, the second pad being one of the plurality of pads which is to receive a predetermined second potential; and (c) applying the first potential to the first pad through the first interconnect line and applying the second potential to the second pad through the second interconnect line.

Preferably, according to a sixth aspect of the present invention, in the method of the fifth aspect, the first and second interconnect lines are connected to the test pads so as to be in two-dimensionally non-overlapping relationship with each other at connecting portions between the first and second interconnect lines and the test pads; and the first and second connecting portions are severed by forming through holes extending from a first major surface of the base film to a second major surface thereof in the first and second connecting portions, respectively.

Preferably, according to a seventh aspect of the present invention, the method of the fifth aspect further comprises the steps of: (d) winding the film carrier onto a reel, the step (d) being performed after the steps (a) and (b) and before the step (c); and (e) loading the reel into a burn-in apparatus, wherein the first and second potentials are applied from a potential supply portion to the first and second interconnect lines, the potential supply portion being connected to the first and second interconnect lines at an end of the film carrier.

In accordance with the first aspect of the present invention, the film carrier includes the first and second interconnect lines which are electrically insulated from each other except where the test pads are provided. Thus, the connecting portions between the first and second interconnect lines and each of the test pads may be selectively severed to leave the connection between the first interconnect line and a test pad or the connection between the second interconnect line and a test pad. This allows different potentials to be applied to pads of the IC chip through the first and second interconnect lines and the test pads connected thereto.

In accordance with the second aspect of the present invention, at least one of the first and second interconnect lines is used also as the plating line. Therefore, the structure of the film carrier is simplified.

In accordance with the third aspect of the present invention, the first and second interconnect lines are formed on the first and second major surfaces of the base film, respectively. Thus, the connecting portions between the first and second interconnect lines and the test pads may be readily severed.

In accordance with the fourth aspect of the present invention, the first and second interconnect lines do not two-dimensionally overlap each other at the connecting portions thereof with the test pads. Thus, the connecting portions of the first and second interconnect lines and the test pads may be severed using a simple apparatus such as a punching machine.

In accordance with the fifth aspect of the present invention, the first potential may be applied only to the first pad by severing the first connecting portion, and the second potential may be applied only to the second pad by severing the second connecting portion. That is, different potentials may be applied to the pads of each IC chip without the need to sever the film carrier into pieces each including an IC chip. Therefore, the method of the fifth aspect of the present invention may collectively conduct the burn-in test on the IC chips included in the film carrier.

In accordance with the sixth aspect of the present invention, the punching machine and the like may be used to sever the first and second connecting portions. The severing using the punching machine is carried out more easily than that using a laser and the like.

In accordance with the seventh aspect of the present invention, the film carrier wound on the reel may be loaded into the burn-in apparatus. This enables an increased number of IC chips to be loaded in the burn-in apparatus at one time to accordingly significantly enhance the processing capability of the burn-in apparatus.

It is therefore an object of the present invention to provide a film carrier which eliminates the need for a burn-in board and a socket for conducting a burn-in test and which allows the reduction in time for preparation for the burn-in test, and a method of burn-in testing using such a film carrier.

These and other objects, features, aspects and advantages of the present invention will become more apparent from the following detailed description of the present invention when taken in conjunction with the accompanying drawings.

DESCRIPTION OF THE PREFERRED EMBODIMENTS

FIRST PREFERRED EMBODIMENT

Figure 1:
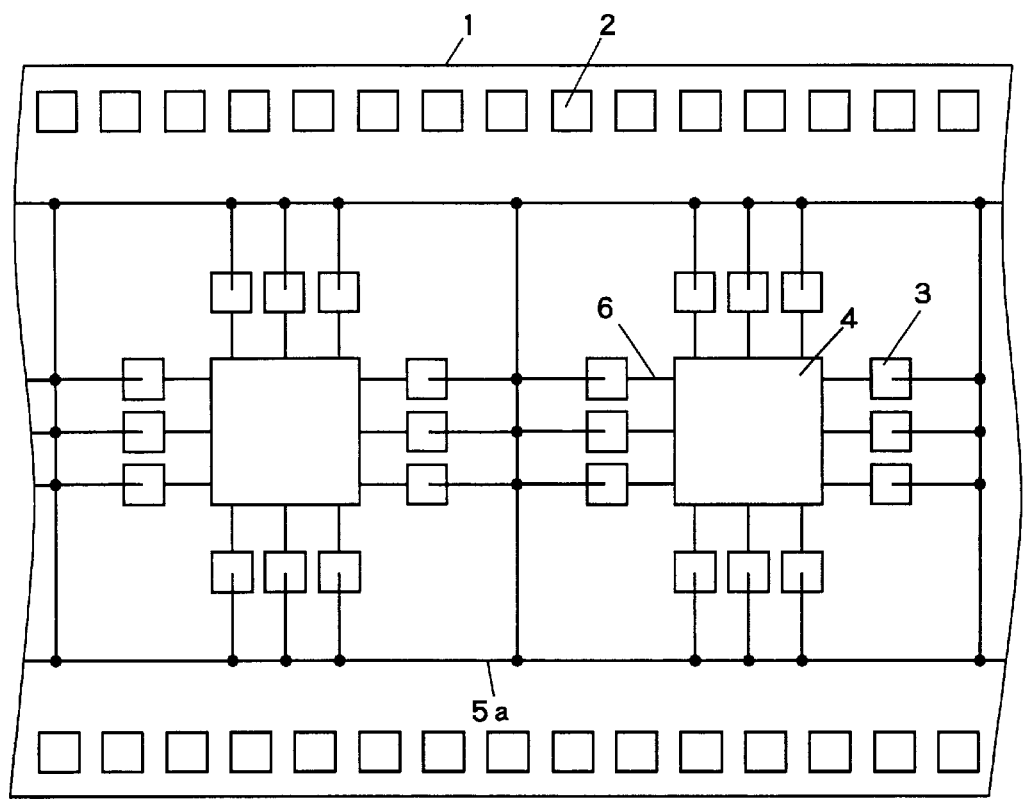
FIG. 1 is a top view showing a top structure of a film carrier according to a first preferred embodiment of the present invention.

FIG. 1 is a top view showing a top structure of a film carrier according to a first preferred embodiment of the present invention. The film carrier comprises a base film 1 provided with a plurality of sprocket holes 2 arranged at regularly spaced apart intervals in the longitudinal direction of the base film 1. IC chips 4 each having a plurality of pads (not shown) are assembled on the base film 1 by the TAB technique. A plurality of test pads 3 in corresponding relation to the plurality of pads of the IC chips 4 are formed on the base film 1. The test pads 3 and the pads of the IC chips 4 are connected to each other through leads 6 formed on the top surface of the base film 1, respectively.

A first interconnect line 5a is formed on the top surface of the base film 1 and is connected commonly to all of the test pads 3. The first interconnect line 5a has two functions. One of the functions is a function as a plating line. Specifically, a predetermined potential is applied from the first interconnect line 5a through the test pads 3 to the leads 6 in a predetermined metal solution to electroplating the surfaces of the leads 6 for improvements in corrosion resistance of the leads 6. The other function of the first interconnect line 5a is to apply a predetermined potential for burn-in to predetermined ones of the pads of the IC chips 4. Specifically, for burn-in testing the IC chips 4, the predetermined potential for burn-in is applied from the first interconnect line 5a through the test pads 3 and the leads 6 to the predetermined ones of the pads of the IC chips 4.

Figure 2:
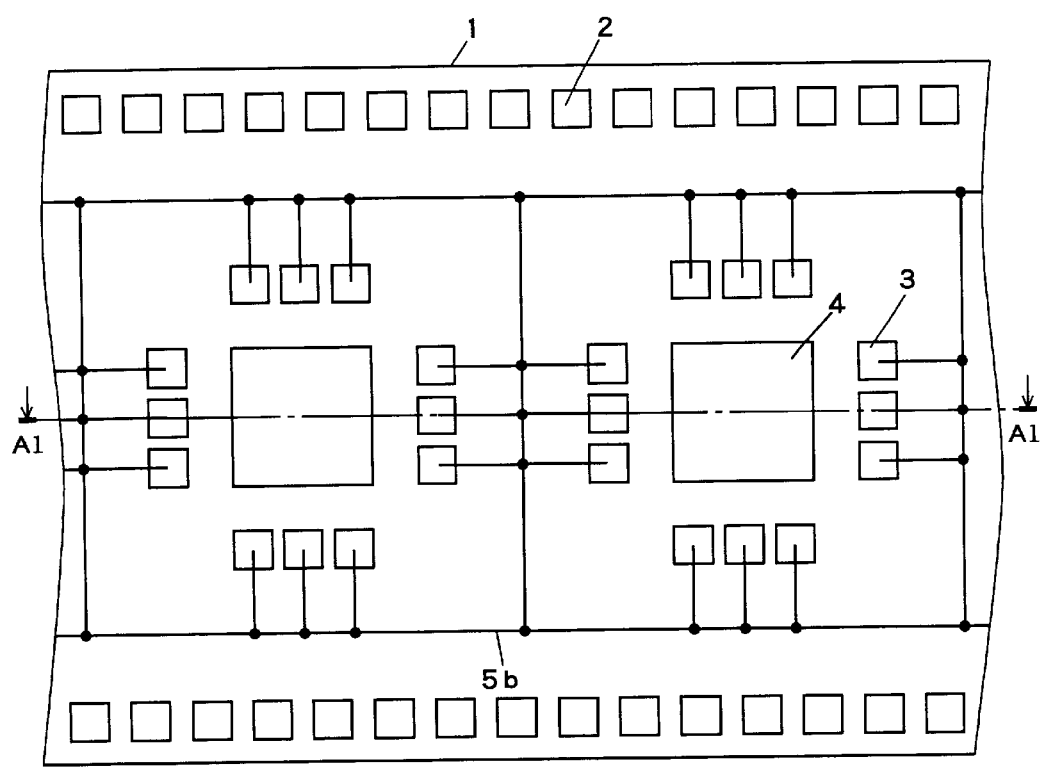
FIG. 2 is a bottom perspective view showing a bottom structure of the film carrier of FIG. 1 as seen through from above.

FIG. 2 is a bottom perspective view showing a bottom structure of the above the film carrier and the same pad 3 as viewed from therebelow.

A second interconnect line 5b connected commonly to all of the test pads 3 is formed on the bottom surface of the base film 1. The second interconnect line 5b functions to apply a predetermined potential for burn-in from the second interconnect line 5b through the test pads 3 and the leads 6 to predetermined ones of the pads of the IC chips 4 for conducting the burn-in test on the IC chips 4. It should be noted that the second interconnect line 5b is actually provided on the back face of the plane of FIG. 2.

Figure 3:
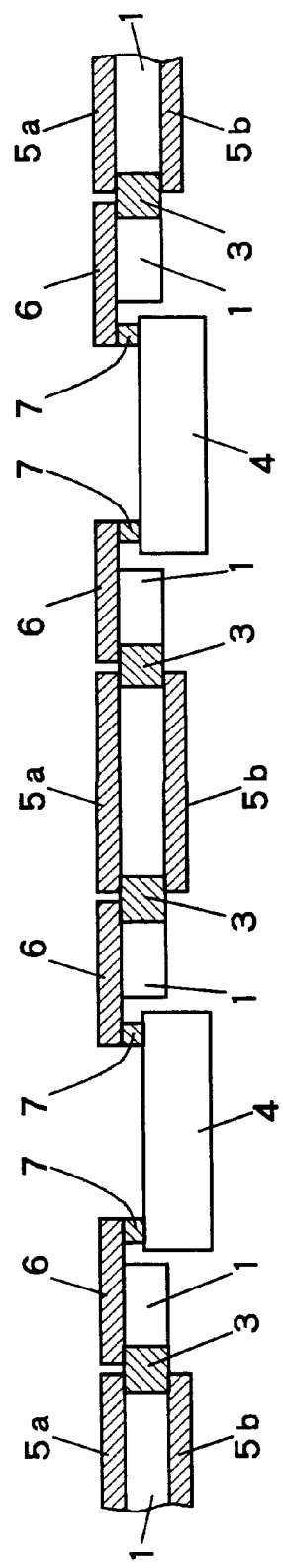
FIG. 3 is a sectional view of the film carrier shown in FIGS. 1 and 2.

FIG. 3 is a sectional view of the film carrier shown in FIGS. 1 and 2, and particularly corresponds to a sectional view taken along the line A1—A1 of FIG. 2. With reference to FIG. 3, the test pads 3 are selectively formed through between the top and bottom surfaces of the base film 1. The first interconnect line 5a formed on the top surface of the base film 1 is connected to the top surfaces of the test pads 3, and the second interconnect line 5b formed on the bottom surface of the base film 1 is connected to the bottom surfaces of the test pads 3. The first interconnect line 5a and the second interconnect line 5b are electrically insulated from each other by the base film 1 but are electrically connected to each other only at positions where the test pads 3 are formed, as shown in FIG. 3. The IC chips 4 and the leads 6 are electrically connected to each other through conductive bumps 7 which are in contact with both the pads of the IC chips 4 and the leads 6.

Figure 4:
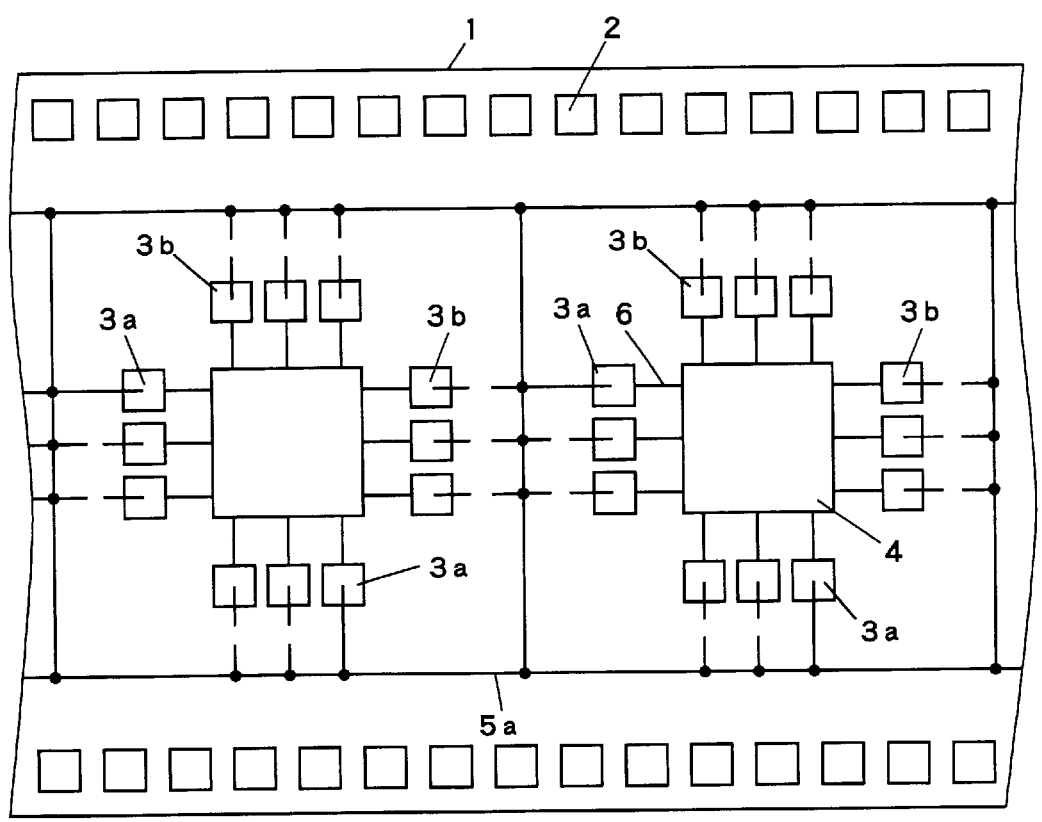
FIGS. 4 through 7 illustrate a method of burn-in testing IC chips in sequential order.
Figure 5:
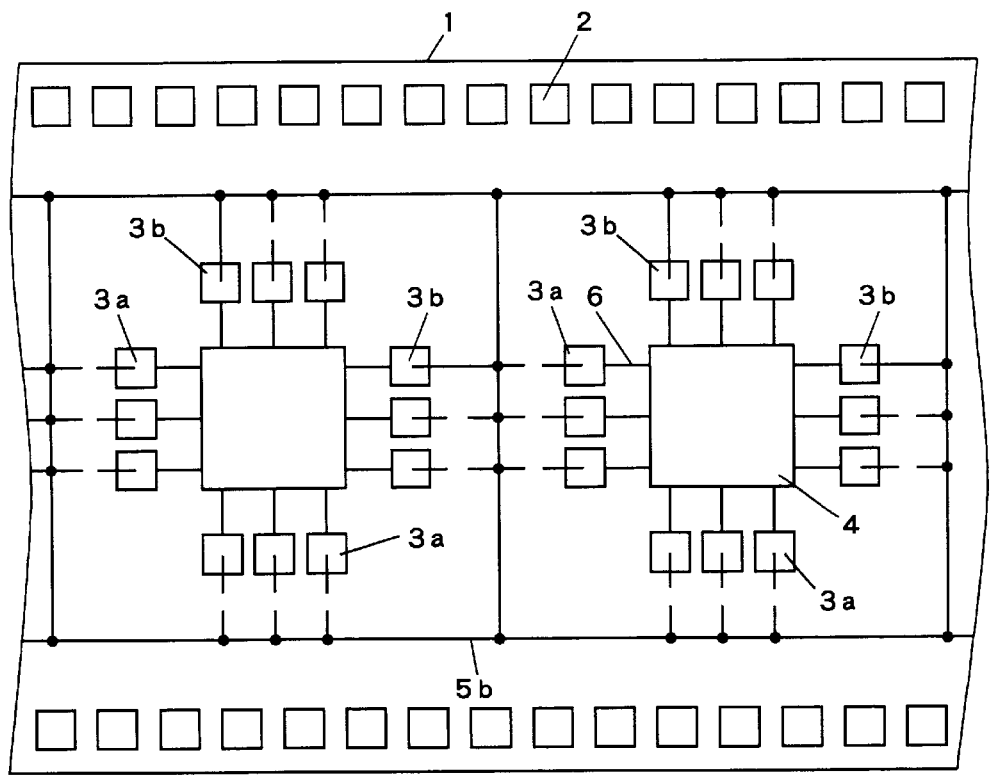

FIGS. 4 through 7 illustrate a method of burn-in testing the IC chips 4 in sequential order. For burn-in test, it is necessary to apply a power supply potential to one or more predetermined pads among all of the pads of each IC chip 4 and to apply a ground potential to one or more predetermined pads different from the former one or more predetermined pads thereamong, with the remaining pads held open. In FIGS. 4 and 5, test pads associated with the pads to which the power supply potential is to be applied are represented as test pads 3a, and test pads associated with the pads to which the ground potential is to be applied are represented as test pads 3b.

All of the test pads 3 are connected to the first interconnect line 5a as depicted in FIG. 1. Thus, after the leads 6 are plated, connecting portions between the test pads other than the test pads 3a and the first interconnect line 5a are severed using a laser, for example (FIG. 4). Further, all of the test pads 3 are connected to the second interconnect line 5b as depicted in FIG. 2. Thus, connecting portions between the test pads other than the test pads 3b and the second interconnect line 5b are severed using a laser, for example (FIG. 5).

Figure 6:
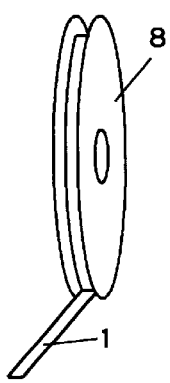
Figure 7:
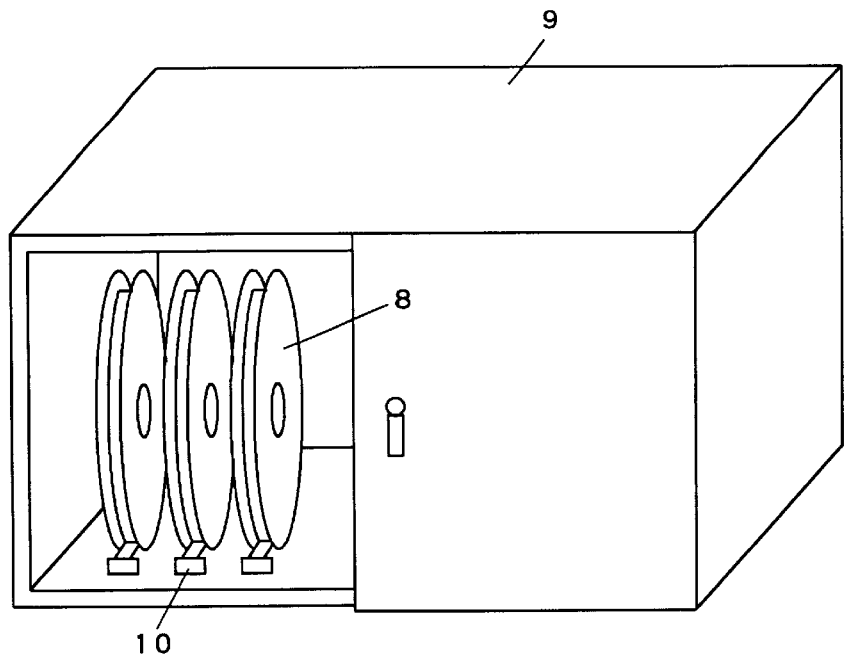

Thereafter, the film carrier is wound onto a reel 8 (FIG. 6). The reel 8 with the film carrier wound thereon is loaded into a burn-in apparatus 9 (FIG. 7). A potential supply portion 10 of the burn-in apparatus 9 applies the power supply potential to the first interconnect line 5a and applies the ground potential to the second interconnect line 5b. This allows the power supply potential to be applied through the first interconnect line 5a and the test pads 3a to the predetermined pads to which the power supply potential is to be applied among all of the pads of the IC chips 4, and allows the ground potential to be applied through the second interconnect line 5b and the test pads 3b to the predetermined pads to which the ground potential is to be applied. Neither the power supply potential nor the ground potential is applied to the remaining pads which are to be held open.

The first interconnect line 5a having the two functions: the function of applying the power supply potential for burn-in to the test pads 3a and the function as the plating line has been described hereinabove. The present invention, however, is not limited to this. For example, an interconnect line for applying the power supply potential for burn-in to the test pads 3a and a plating line may be individually provided. The first interconnect line 5a having the two functions may, though, simplify the structure of the film carrier.

With the film carrier and the method of burn-in testing according to the first preferred embodiment of the present invention, since the film carrier is not required to be severed into pieces each including an IC chip 4 prior to the burn-in testing, the need for the burn-in board and sockets which have been required in the conventional burn-in method is eliminated. This achieves the reductions in costs, the number of process steps, and time for preparation for burn-in.

Additionally, since the film carrier which is wound on the reel 8 is loaded into the burn-in apparatus 9, an increased number of IC chips 4 may be loaded into the burn-in apparatus 9 at one time. This significantly enhances the processing capability of the burn-in apparatus 9.

Further, the first interconnect line 5a and the second interconnect line 5b are previously connected to all of the test pads 3, and the connecting portions between the first interconnect line 5a and the test pads and the connecting portions between the second interconnect line 5b and the test pads are then severed as required. Therefore, the first preferred embodiment of the present invention is applicable to any pattern for providing the power supply potential and the ground potential, providing increased flexibility.

SECOND PREFERRED EMBODIMENT

Figure 8:
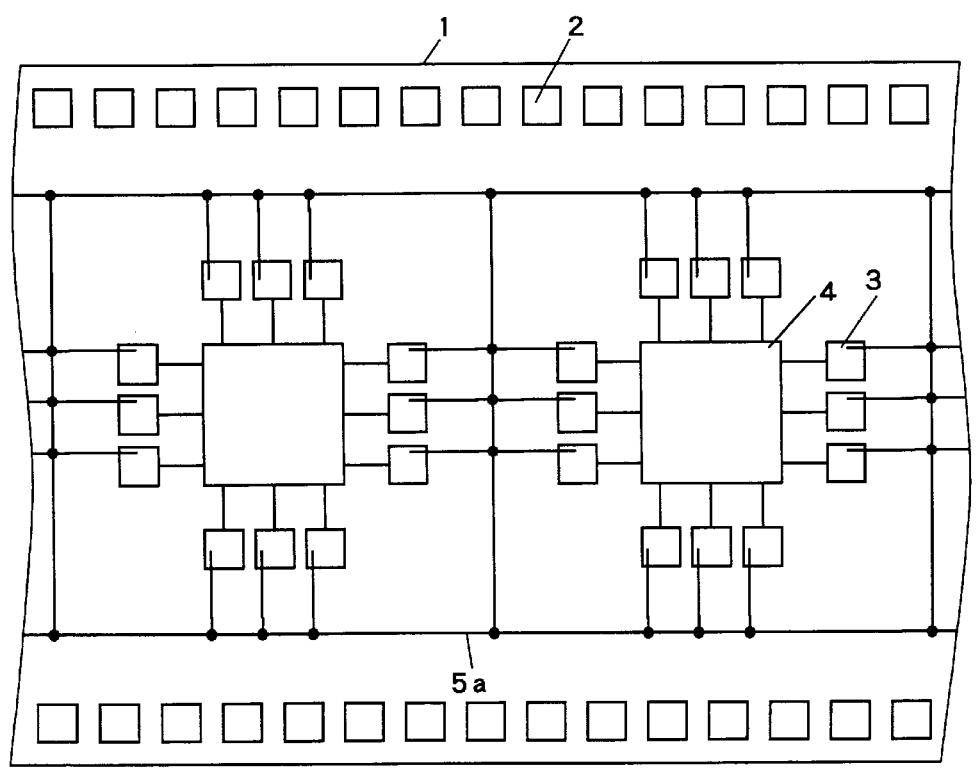
FIG. 8 is a top view showing a top structure of the film carrier according to a second preferred embodiment of the present invention.
Figure 9:
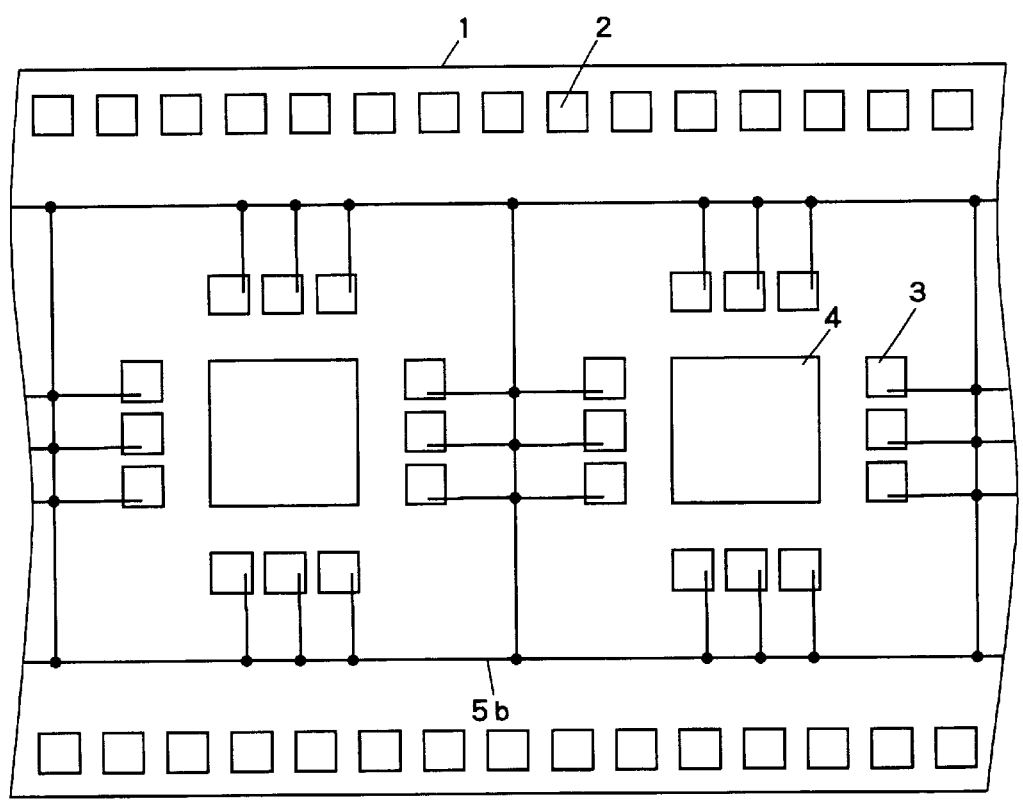
FIG. 9 is a bottom perspective view showing a bottom structure of the film carrier of FIG. 8 as seen through from above.

FIG. 8 is a top view showing a top structure of the film carrier according to a second preferred embodiment of the present invention. The basic construction of the second preferred embodiment shown in FIG. 8 is similar to that of the first preferred embodiment shown in FIG. 1, but differs therefrom in that the first interconnect line 5a is connected to the top surface of each test pad 3 at a position shifted toward one end thereof rather than at its central position. FIG. 9 is a bottom perspective view showing a bottom structure of the film carrier of FIG. 8 as seen through from above. The basic construction of the second preferred embodiment shown in FIG. 9 is similar to that of the first preferred embodiment shown in FIG. 2, but differs therefrom in that the second interconnect line 5b is connected to the bottom surface of each test pad 3 at a position shifted toward the opposite end thereof rather than at its central position. Such connections of the first interconnect line 5a to a first end portion of the top surface of each test pad 3 and of the second interconnect line 5b to a second end portion, which is opposite from the first end portion, of the top surface of each test pad 3 prevent the first interconnect line 5a and the second interconnect line 5b from two-dimensionally overlapping each other at the connecting portions thereof with the test pads 3.

Figure 10:
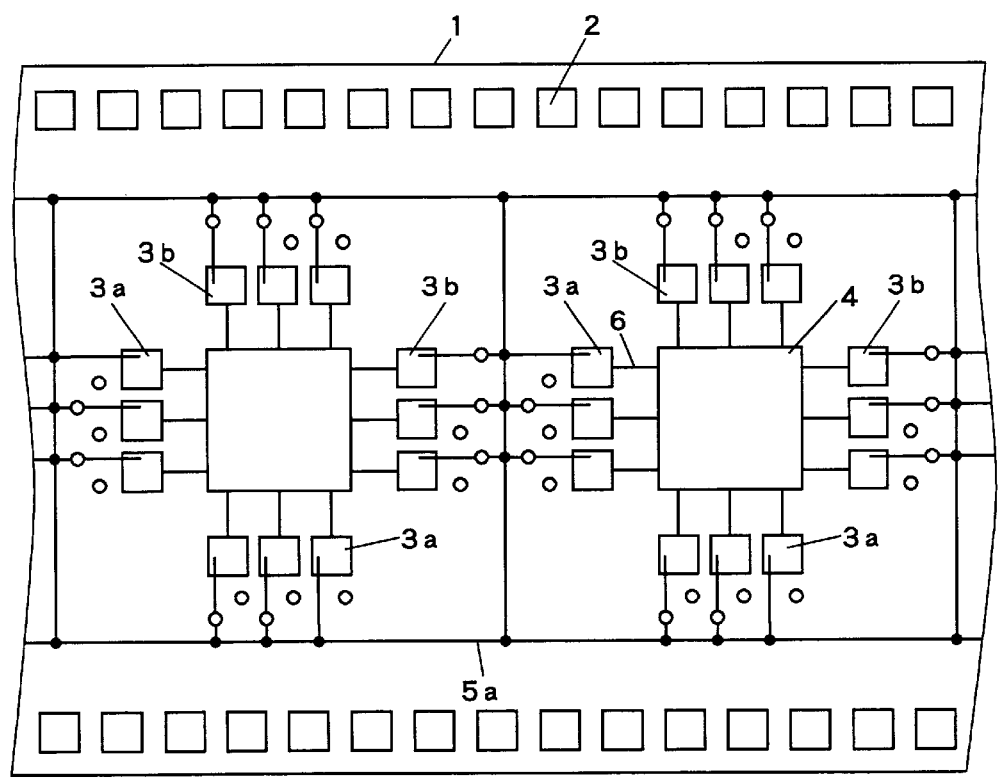
FIGS. 10 and 11 illustrate the method of burn-in testing the IC chips.
Figure 11:
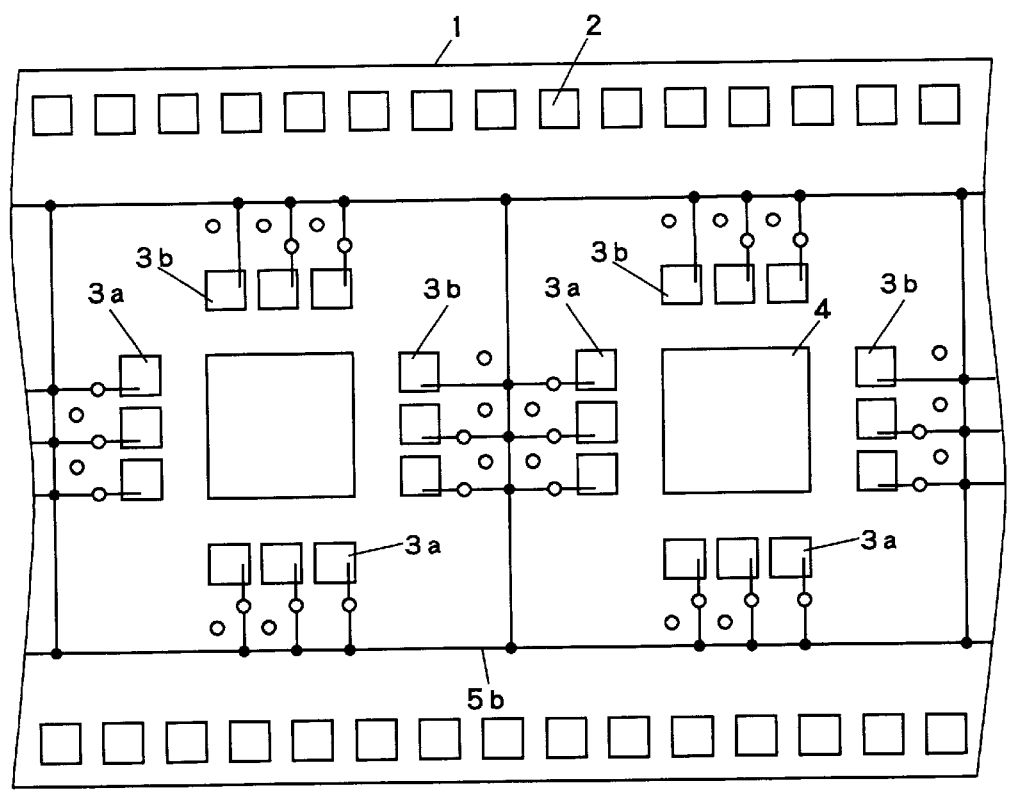
Figure 12:
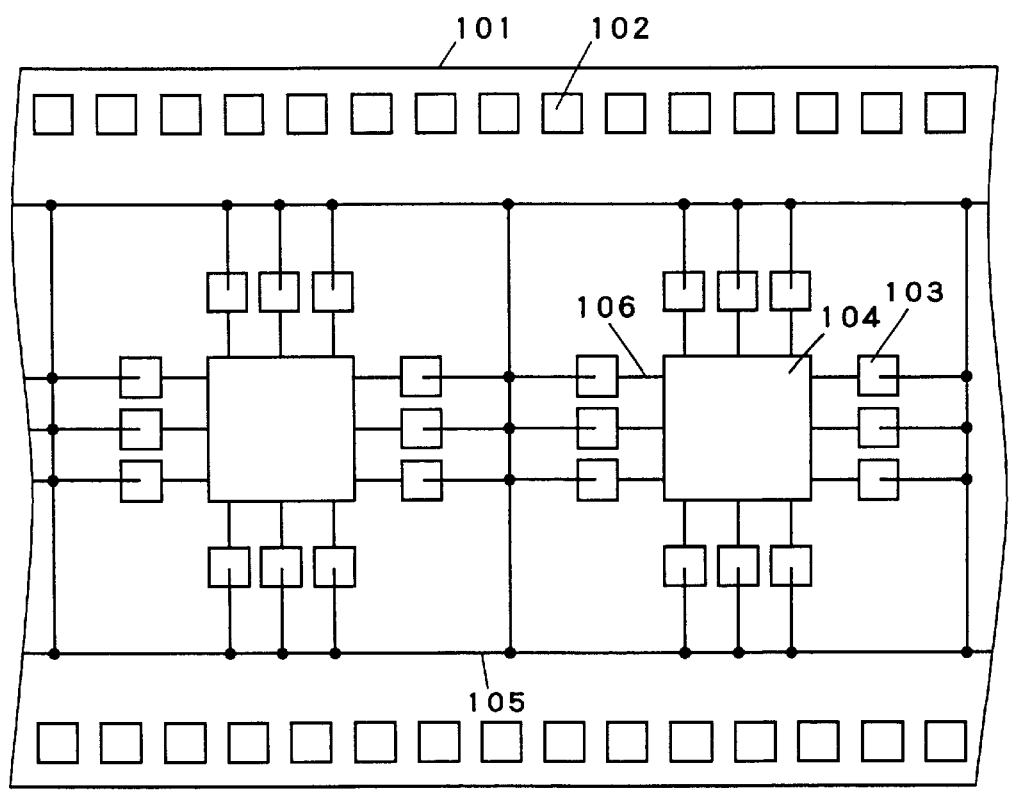
FIG. 12 is a top view showing a top structure of a conventional film carrier.
Figure 13:
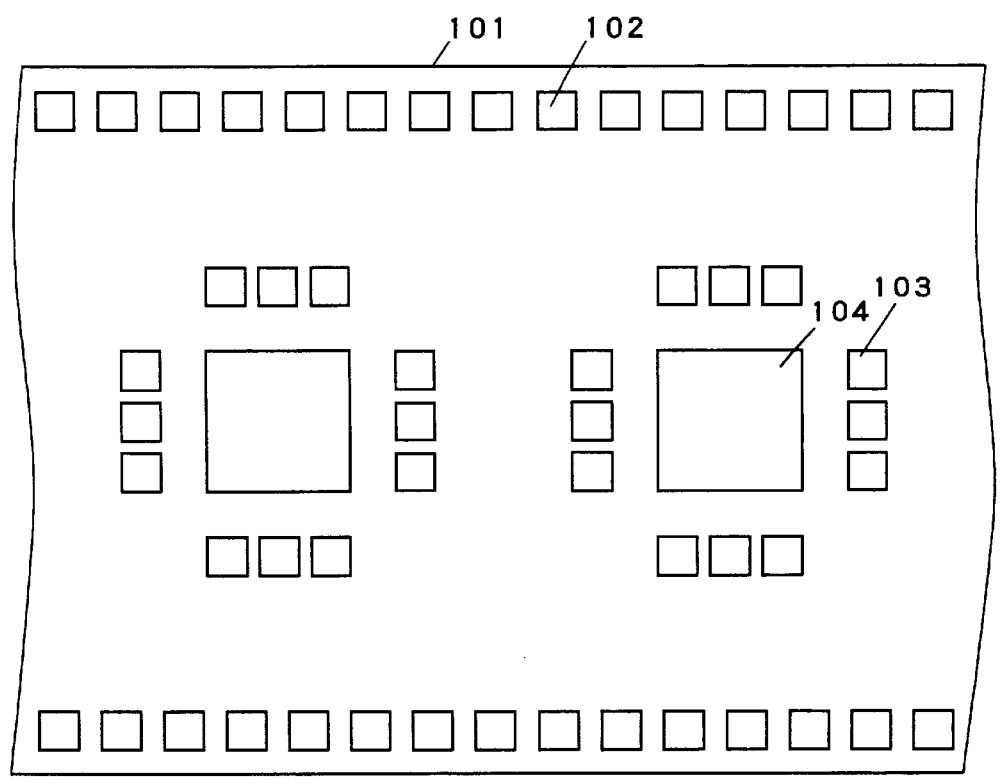
FIG. 13 is a bottom perspective view showing a bottom structure of the film carrier of FIG. 12 as seen through from above.
Figure 14:
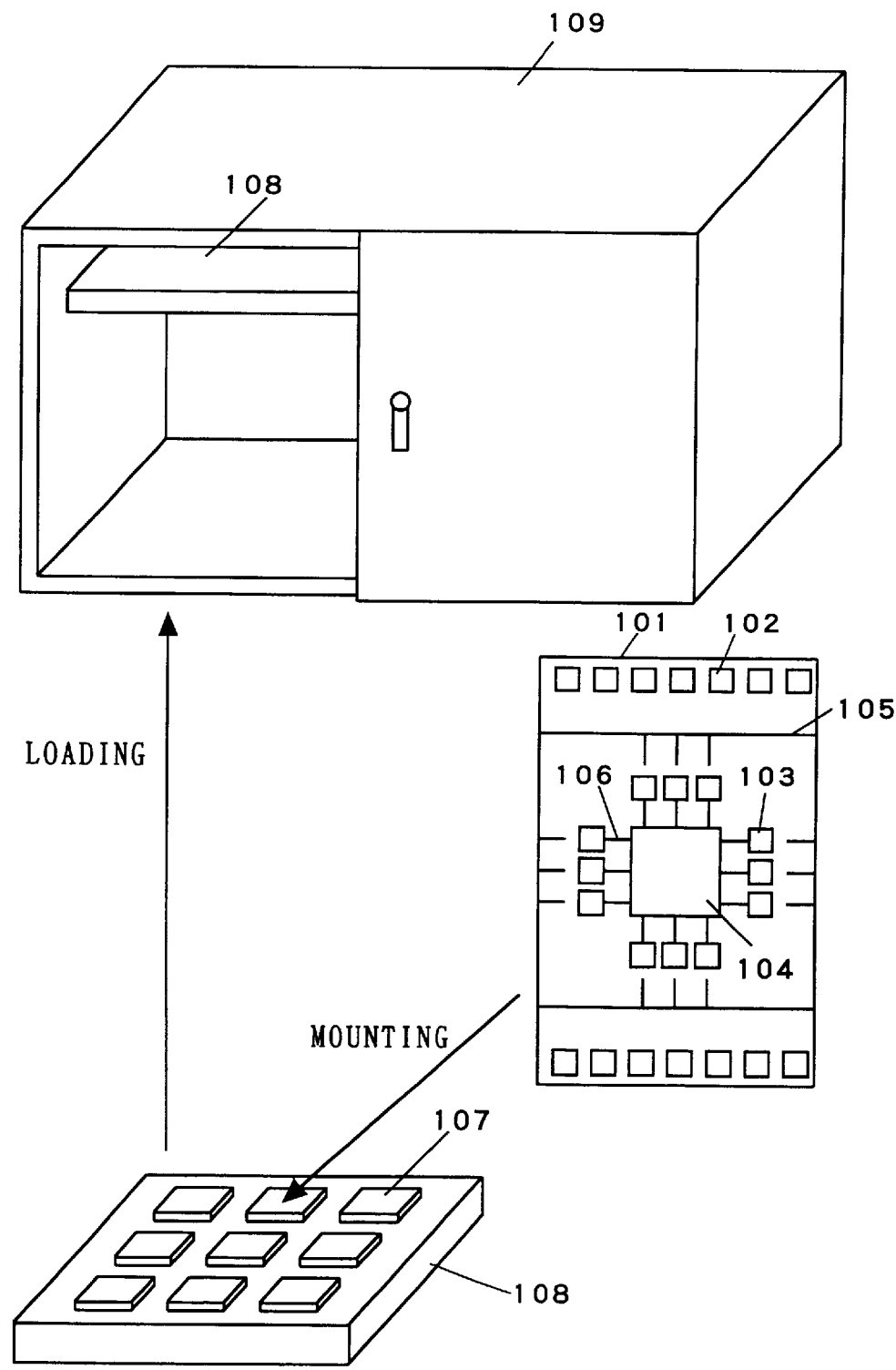
FIG. 14 illustrates a conventional method of burn-in testing IC chips.

Description will be given hereinafter on the method of burn-in testing the IC chips 4. FIGS. 10 and 11 illustrate one of the steps of burn-in testing the IC chips 4. With reference to FIGS. 10 and 11, the test pads 3a are those associated with the pads to which the power supply potential is to be applied among all of the pads of the IC chips 4, and the test pads 3b are those associated with the pads to which the ground potential is to be applied among all of the pads of the IC chips 4. As illustrated in FIGS. 8 and 9, all of the test pads 3 are connected to the first interconnect line 5a and the second interconnect line 5b. Thus, through holes extending from the top surface of the base film 1 to the bottom surface thereof are formed using a punching machine and the like so that the connecting portions between the test pads other than the test pads 3a and the first interconnect line 5a are cut off and the connecting portions between the test pads other than the test pads 3b and the second interconnect line 5b are cut off (FIGS. 10 and 11).

The subsequent process steps of the second preferred embodiment are similar to those of the first preferred embodiment. Specifically, the film carrier is wound onto the reel 8, and the reel 8 with the film carrier wound thereon is loaded into the burn-in apparatus 9. Then, the potential supply portion 10 of the burn-in apparatus 9 applies the power supply potential to the first interconnect line 5a and applies the ground potential to the second interconnect line 5b.

With the film carrier and the method of burn-in testing according to the second preferred embodiment of the present invention, the first interconnect line 5a and the second interconnect line 5b do not two-dimensionally overlap each other at the connecting portions thereof with the test pads 3. Therefore, the connecting portions between the test pads other than the test pads 3a and the first interconnect line 5a and the connecting portions between the test pads other than the test pads 3b and the second interconnect line 5b may be readily cut off only by forming the through holes extending between the top and bottom surfaces of the base film 1.

While the invention has been described in detail, the foregoing description is in all aspects illustrative and not restrictive. It is understood that numerous other modifications and variations can be devised without departing from the scope of the invention.

I claim:

1. A film carrier comprising:

a base film;

a plurality of test pads provided on said base film in corresponding relation to a plurality of pads of an IC chip assembled on said base film;

a first interconnect line provided on said base film and connected commonly to said plurality of test pads; and a second interconnect line provided on said base film and connected commonly to said plurality of test pads, said second interconnect line being insulated from said first interconnect line.

2. The film carrier according to claim 1, wherein at least one of said first and second interconnect lines is a plating line for electroplating leads for providing connection between said test pads and said pads.

3. The film carrier according to claim 1, wherein said plurality of test pads extend through said base film.

4. The film carrier according to claim 1, wherein said first interconnect line and said second interconnect line receive a first potential and a second potential different from said first potential respectively from a potential supply portion.

5. The film carrier according to claim 1, wherein said plurality of test pads couple to said plurality of pads of said IC chip.

6. The film carrier according to claim 1, wherein said plurality of test pads are connected to said plurality of pads of said IC chip respectively through leads.

7. The film carrier according to claim 1, wherein said plurality of test pads are selectively formed through between first and second major surfaces of said base film, said first interconnect line being provided on said first major surface of said base film, said second interconnect line being provided on said second major surface of said base film.

8. The film carrier according to claim 7, wherein said first and second interconnect lines are connected to said test pads so as to be in two-dimensionally non-overlapping relationship with each other at connecting portions between said first and second interconnect lines and said test pads.

9. The film carrier according to claim 1, wherein said first interconnect line is provided on a surface of said base film, and said second interconnect line is provided on another surface of said base film.

10. The film carrier according to claim 9, wherein said first and second interconnect lines are connected to said test pads so as to be in two-dimensionally nonoverlapping relationship with each other at connecting portions between said first and second interconnect lines and said test pads.

11. The film carrier according to claim 1, wherein said base film has a plurality of sprocket holes.

12. The film carrier according to claim 11, wherein a plurality of portions for spacing said IC chip are provided along a predetermined direction on said base film, said plurality of sprocket holes are equally spaced along said predetermined direction.

13. A film carrier comprising:

a base film;

a plurality of test pads provided on said base film, said plurality of test pads being connected to a plurality of pads of an IC chip;

a first interconnect line provided on a surface of said base film and connected commonly to said plurality of test pads; and a second interconnect line provided on another surface of said base film and connected commonly to said plurality of test pads.

14. The film carrier according to claim 13, wherein said first and second interconnect lines are connected to said test pads so as to be in two-dimensionally non-overlapping relationship with each other at connecting portions between said first and second interconnect lines and said test pads.

* * * * *

UNITED STATES PATENT AND TRADEMARK OFFICE
CERTIFICATE OF CORRECTION

PATENT NO. : 6,300,577 B1 Page 1 of 1
DATED : October 9, 2001
INVENTOR(S) : Tsujii It is certified that error appears in the above-identified patent and that said Letters Patent is hereby corrected as shown below:

<u>Title page,</u>
Item [73], Assignee's information should read:
-- [73]   Assignee:   Mitsubishi Denki Kabushiki Kaisha,
                     Tokyo (JP) --

Signed and Sealed this

Fourth Day of June, 2002

*Attest:*

JAMES E. ROGAN
*Attesting Officer*    *Director of the United States Patent and Trademark Office*